US008614920B2

(12) United States Patent
Chan et al.

(10) Patent No.: US 8,614,920 B2
(45) Date of Patent: Dec. 24, 2013

(54) METHOD AND APPARATUS FOR LOGIC READ IN FLASH MEMORY

(75) Inventors: Johnny Chan, Fremont, CA (US); Teng Su, Milpitas, CA (US); Michael Chi Li, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 76 days.

(21) Appl. No.: 13/437,888

(22) Filed: Apr. 2, 2012

(65) Prior Publication Data

US 2013/0258783 A1    Oct. 3, 2013

(51) Int. Cl.
    *G11C 11/34* (2006.01)
(52) U.S. Cl.
    USPC ................................. 365/185.18; 365/185.24
(58) Field of Classification Search
    USPC .......................................... 365/185.18, 185.24
    See application file for complete search history.

(56) References Cited

U.S. PATENT DOCUMENTS

| 5,043,874 A * | 8/1991 | Gagliardo et al. ............ 711/151 |
| 7,558,900 B2 | 7/2009 | Jigour et al. |
| 2006/0095750 A1 * | 5/2006 | Nye et al. ....................... 712/240 |
| 2009/0097346 A1 * | 4/2009 | Rao ................................. 365/203 |

FOREIGN PATENT DOCUMENTS

| JP | 11-353887 | 12/1999 |
| JP | 2001-092804 | 4/2001 |
| JP | 2003-016788 | 1/2003 |
| JP | 2004-046649 | 2/2004 |
| JP | 2005-302134 | 10/2005 |
| JP | 2006-514761 | 5/2006 |
| JP | 2010-044638 | 2/2010 |
| JP | 2010-511943 | 4/2010 |
| WO | 2007116483 A1 | 10/2007 |
| WO | 2007116486 A1 | 10/2007 |

OTHER PUBLICATIONS

Winbond Electronics Corporation, W25Q64DW spiflash 1.8V 64M-Bit Serial Flash Memory with Dual/Quad SPI and QPI, Preliminary Revision C, Jan. 13, 2011, 82 pages.
Winbond Electronics Corporation, W25Q64FV spiflash 3V 64M-Bit Serial Flash Memory with Dual/Quad SPI & QPI, Preliminary Revision A, Mar. 22, 2011, 82 pages.
Japanese Patent Office. Office Action: Japanese Patent Application No. 2012-214724, Sep. 25, 2013. 2 Pages.
Japanese Patent Office. Office Action (Translation): Japanese Patent Application No. 2012-214724, Sep. 25, 2013. 2 Pages.

* cited by examiner

*Primary Examiner* — Michael Tran
(74) *Attorney, Agent, or Firm* — David H. Carroll (57) ABSTRACT

The timing of logic read operations in a Flash memory device may be improved by a pad serial output circuit which receives a pre-decoded instruction signal and pre-fetched logic data prior to the last command clock, and which performs a fast resolution of the command in the pad serial output circuit on the last clock of the command input sequence. In one illustratively implementation, instruction pre-decode and data pre-fetch may be done on the seventh clock during command input. In another illustrative implementation, a first instruction pre-decode and data pre-fetch may be done on the fourth clock during command input, and a second instruction pre-decode may be done on the seventh clock during command input. Both serial protocol interface, including dual and quad I/O SPI, and quad peripheral interface are supported.

12 Claims, 9 Drawing Sheets

METHOD AND APPARATUS FOR LOGIC READ IN FLASH MEMORY

BACKGROUND OF THE INVENTION

1. Field of the Invention

The present invention relates to Flash memory, and more particularly to the reading of logical data from a Flash memory.

2. Description of Related Art

Single-bit serial and multiple-bit serial Flash memory has become popular due to low pin count and simplicity of the interface. The simplest interface is the one-bit Serial Peripheral Interface ("SPI"). The one-bit SPI protocol involves sending a 8-bit command, address bytes, and optional dummy bytes by a user to the SPI Flash memory device, and in response the SPI Flash memory device returns data to the user. A unique 8-bit command may identify a read, an erase/program, or another appropriate operation. Multiple-bit serial interfaces such as SPI-Dual, SPI-Quad, and the Quad Peripheral Interface ("QPI") have been developed for high performance system applications which require fast read performance. In the SPI-Quad interface, an 8-bit command is provided serially one bit at a time, but all subsequent fields (e.g. address, optional dummy bytes, and data) are done on a 4-bit (Quad) serial basis to improve read thru-put. In the QPI interface, all of the fields (e.g. 8-bit command, address, optional dummy bytes, and data) are done in 4-bit serial. As such, the QPI interface provides an 8-bit command in two clock cycles, whereas the SPI-Quad needs eight clock cycles. Various multiple-bit serial Flash interface protocols are described in, for example, U.S. Pat. No. 7,558,900 issued Jul. 7, 2009 to Jigour et al.

Figure 1:
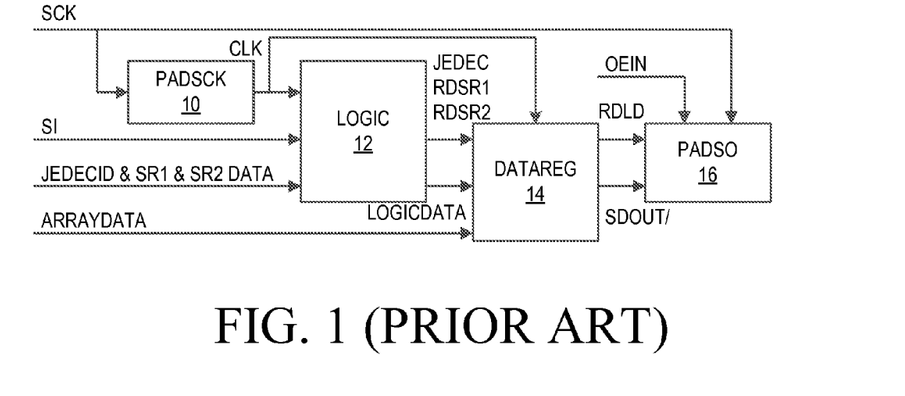
FIG. 1 is a block schematic diagram of pad, logic and data register circuits for a Flash memory device of the prior art.

Read operations by Flash memory typically include memory array read and logic read types. FIG. 1 is a schematic block diagram of circuits used in a typical Flash memory for performing a logic read. Logic 12 receives logic data such as status data and JEDEC manufacturer and part identification data from various registers 4. The logic 12 also receives serial input SI, which contains commands and various input data. The logic 12 fully decodes each command on the eighth clock, selects JEDECID, SR1 data or SR2 data if the command is a JEDEC, RDSR1 or RDSR2 command respectively, and provides the selected logic data as LOGICDATA to data register DataReg 14. The DataReg 14 also receives a data input ARRAYDATA from the memory cell array when the command is a memory read command. Based on input signals JEDEC, RDSR1 and RDSR2 from logic 12, the DataReg 14 selects either the logic data LOGICDATA or the array data ARRAYDATA and outputs the selected data as serial data out signal SDOUT/. A pad serial output circuit PadSO 16 includes an output driver which outputs SDOUT to a contact such as a lead, pad or pin of the packaged Flash memory device when enabled by either signal RDLD when SDOUT is logic data, and by signal OEIN when SDOUT is memory array data. The PadSO 16 is clocked by the system clock SCK, but the logic 12 and the DataReg 14 are clocked by clock signal CLK, which is the SCK clock buffered by Pad-SCK 10.

Figure 2:
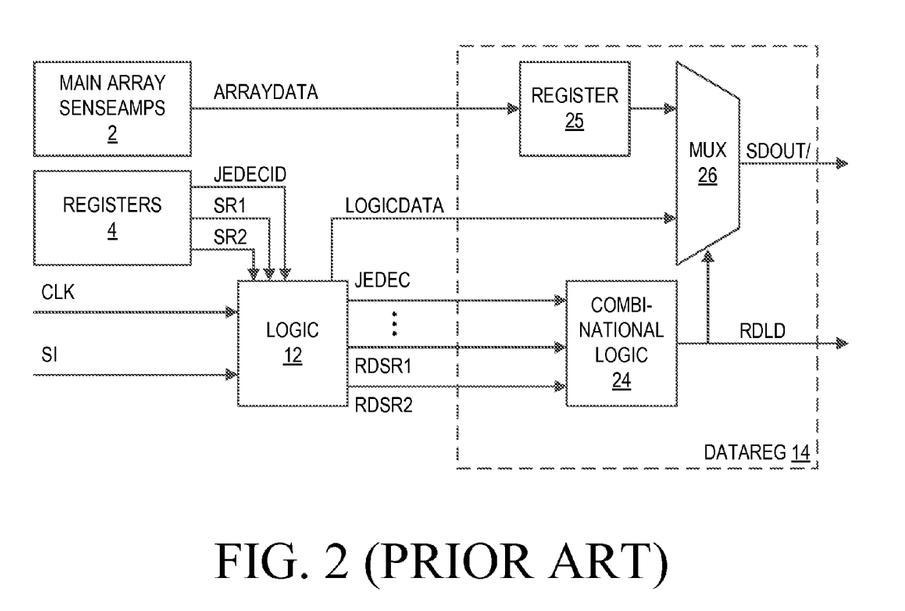
FIG. 2 is a detailed block schematic diagram of the logic circuit of FIG. 1.

The logic 12 is shown in greater detail in FIG. 2. The logic 12 decodes commands in the serial input SI and provides a signal which uniquely identifies logic read commands, illustratively signal JEDEC for a JEDECID read command, signal RDSR1 for a status register one read command, and signal RDSR2 for a status register two read command. These signals are combined in combinational logic 24 to obtain the signal RDLD indicative of a logic data read command. Signal RDLD is applied to the select input of multiplexer 26, which selects LOGICDATA from one of its data inputs when the signal RDLD is asserted, and otherwise selects data from register 25, which stores memory array data received from the main array sense amplifiers 2.

Figure 3:
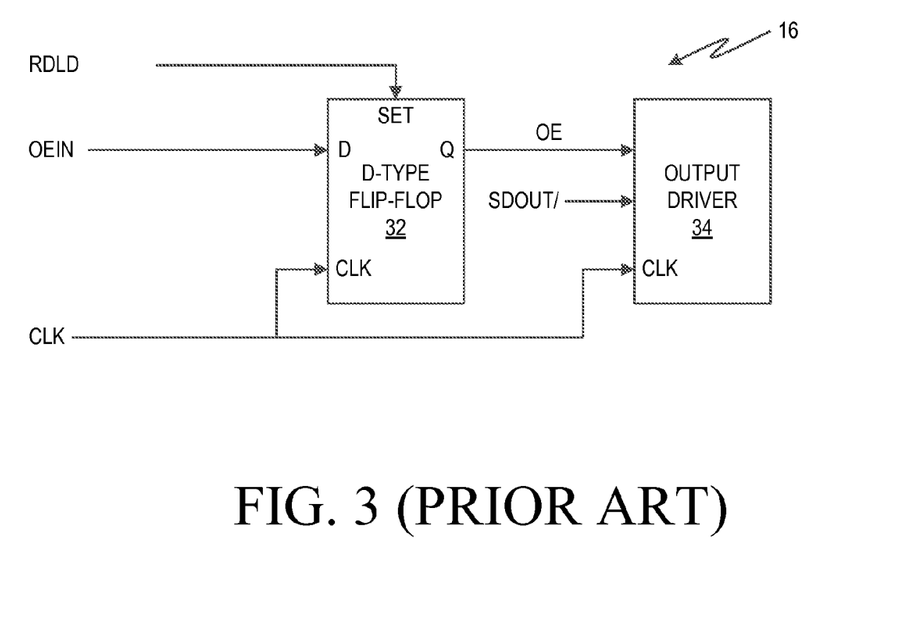
FIG. 3 is a detailed block schematic diagram of the pad output circuit of FIG. 1.

PadSO 16 is shown in greater detail in FIG. 3. Output driver 34 is controlled by an output enable signal OE from D-type flip-flop 32, and clocked by CLK. The D-type flip-flop generates OE based on signal RDLD applied to the SET input and signal OEIN applied to the D input. Input OEIN is used for an array read. The D-type flip-flop 32 and the output driver 34 are both clocked by CLK.

SUMMARY OF THE INVENTION

One embodiment of the present invention is a Flash memory device which includes a capability of outputting logic data in response to a set of logic read commands, comprising an external signal input; an addressable Flash memory cell array; a data register coupled to the addressable Flash memory cell array for receiving and storing array data from the addressable Flash memory cell array; a plurality of registers for storing logic data, and a command and control logic circuit. The command and control logic circuit comprises pre-fetch logic coupled to the external signal input for pre-fetching logic data from one of the logic data registers in accordance with a particular one of the plurality of logic read commands when a first partial sequence of most significant bits of a command received on the external signal input is predictive of the particular logic data read command; and output control logic coupled to the external signal input for generating a predicted logic read command signal when a second partial sequence of most significant bits of a command received on the external signal input is predictive of any one of the plurality of logic data read commands. The Flash memory device further comprises an output pad circuit coupled to the data register, the pre-fetch logic, the output control logic, and the external signal line for selecting and outputting the logic data from the pre-fetch logic when the predicted logic read command signal and a portion of the command other than the first and second partial sequences resolve receipt of any one of the plurality of logic data read commands.

Another embodiment of the present invention is a method of operating a memory device having a Flash memory cell array to provide logic data to an application in response to a logic read command having a predetermined number of command bits, comprising: receiving a sequence of bits of a command fewer than the predetermined number of command bits, the sequence of received bits being most significant bits of the command; pre-decoding the sequence of received bits in a logic circuit of the memory device to identify when the sequence of received bits matches a corresponding sequence of bits of a logic read command; completing decoding of remaining bits of the command in a pad output circuit to identify when the match in the pre-decoding step correctly predicts the logic read command; and outputting logic data in accordance with the logic read command.

Another embodiment of the present invention is a method of operating a memory device having a Flash memory cell array to provide logic data to an application in response to logic read commands having a predetermined number of command bits, comprising: receiving a first sequence of bits of a command fewer than the predetermined number of command bits, the first sequence of received bits being most significant bits of the command; pre-decoding the first sequence of received bits in a logic circuit of the memory device to identify when the first sequence of received bits matches a corresponding sequence of bits of a logic read command; pre-fetching logic data in accordance with the logic read command matched in the pre-decoding step; receiving a second sequence of bits of a command fewer than the predetermined number of command bits and greater than the first sequence of bits, the second sequence of received bits being most significant bits of the command; pre-decoding the second sequence of received bits in a logic circuit of the memory device to identify when the second sequence of received bits matches a corresponding sequence of bits of a logic read command; completing decoding of remaining bits of the command in a pad output circuit to identify when the match in the second sequence pre-decoding step correctly predicts the logic read command; and outputting the logic data pre-fetched in the pre-fetching step. In a variation, the first and second sequence of most significant bits is seven bits. In another variation, the first sequence of most significant bits is four bits, and the second sequence of most significant bits is seven bits.

DETAILED DESCRIPTION OF THE INVENTION INCLUDING THE BEST MODE

Flash memory is suitable for a great variety of digital electronic devices and systems. However, higher performing devices and systems generally require Flash memory that operates at a higher frequency. In the case of memory read operations, for example, the use of dummy clocks after the command allows for a higher frequency operation, but the speed of the logic read operations may still present a bottleneck. The problem is due to successive delays in the command decode and logic circuit, the data register circuit, and the interconnecting internal signal lines.

Consider the JEDEC read command (9Fh) and the Status Register-1 Read (RDSR1 05h) and Status Register-2 Read (RDSR2 35h) commands, which are examples of logic read operations. The JEDEC read command outputs the manufacturer and device ID bytes from the device, for determining the identity of the device. The RDSR1 and RDSR2 read commands output the contents of the first and second status registers, respectively.

Figure 4:
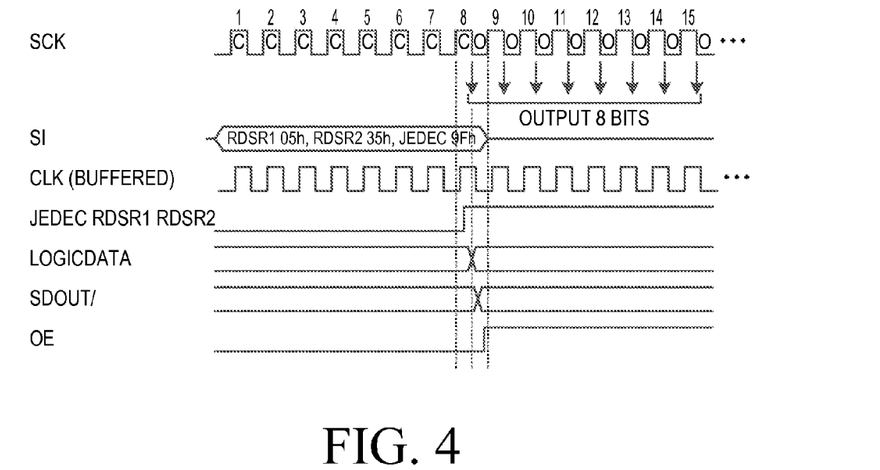
FIG. 4 is a timing diagram showing a failure condition of the Flash memory device of FIG. 1.

FIG. 4 is a timing diagram for either the JEDEC, RDSR1 or RDSR2 operations at a very high frequency of operation and assuming no other bottlenecks in the Flash memory device. Serial input SI includes 8 clocks for clocking in 8 command bits at the rising edges, followed by a number of additional clocks for clocking out data at their falling edges. The Flash memory may be designed so that the eighth clock not only clocks in the least significant bit of the command at its rising edge, but also clocks out the first data bit at its falling edge, as indicated by the left-most downward-directed arrow. Therefore, the timing margin for completing command decode and fetch and output data is a very short half-cycle.

Figure 5:
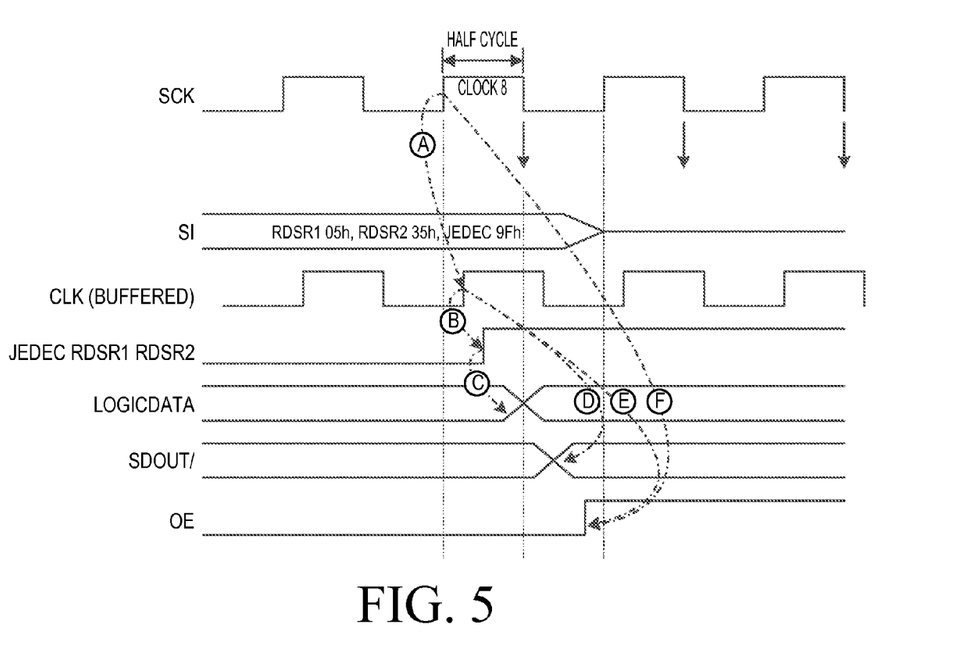
FIG. 5 is a timing diagram showing a portion of the timing diagram of FIG. 4 in greater detail.

Unfortunately, assuming no other bottlenecks in the Flash memory, the half-cycle timing margin is insufficient as the frequency of operation is raised beyond a certain point, as shown in greater detail in FIG. 5. While there are many delays, some of the more significant delays are indicated by arrows A, B, C, D and E. Arrow A indicates the delay caused by buffering of the system clock SCK so that the internal clock CLK may be provided. Arrow B indicates the delay until signal JEDEC, RDSR1 or RDSR2 is generated upon by decoding of the command after arrival of the eighth bit. Arrow C indicates the delay in the logic 12 when selecting the appropriate logic data after signal JEDEC, RDSR1 or RDSR2 is generated. Arrow D indicates the delay relative to the rising edge of CLK in the combinational logic 24 and multiplexer 26 (FIG. 2) of the DataReg 14 when selecting between ARRAY-DATA and LOGICDATA for outputting SDOUT/. Arrow E indicates the delay relative to the rising edge of CLK along the RDLR signal path and in D-type flip-flop 32 in generating signal OE which enables the output driver 34. Arrow F indicates the entire delay, which in this example is nearly a full cycle and greatly exceeds the half-cycle timing margin.

Higher frequency operation of Flash memory is generally desirable. While improved timing in memory array read operations may eliminate these as bottlenecks, timing delays in the logic read operation may cause the half-cycle timing margin for to be exceeded and therefore become the next bottleneck for higher frequency operation. Advantageously, the various implementations described herein improve timing of logic read operations in various ways.

The timing of logic read operations may be improved by a pad serial output circuit which receives a pre-decoded instruction signal and pre-fetched logic data prior to the last command clock, and which performs a fast resolution of the command in the pad serial output circuit on the last clock of the command input sequence to avoid sequential logic circuit delays, data register delays, and internal signal line delays. In one illustrative SPI implementation, instruction pre-decoding is done on the seventh clock during command input, and used to generate a pre-command signal that may be provided to the pad serial output circuit early, and also to pre-fetch logic data that may be provided to the pad serial output circuit early. In another illustrative SPI implementation, an instruction pre-decoding is done on the fourth clock during command input for generating a pre-command signal that may be provided to the pad serial output circuit early, and another instruction pre-decode is done on the seventh clock during command input for pre-fetch logic data that may be provided to the pad serial output circuit early. In an illustrative QPI implementation, an instruction pre-decoding is done on the first clock during 4-bit command input for generating a pre-command signal that may be provided to each of four pad serial output circuits early, and also to pre-fetch logic data that may be provided to each of the four pad serial output circuits early. Fast command resolution may be done in each of the four pad serial output circuits on the second clock of the command input sequence, with each of the four pad serial output circuits illustratively receiving the four least significant bits of the command. These techniques of instruction pre-decode, logic data pre-fetch, and fast command resolution in the pad serial output circuit may be used together in any combination or individually to improve logic read timing.

Figure 6:
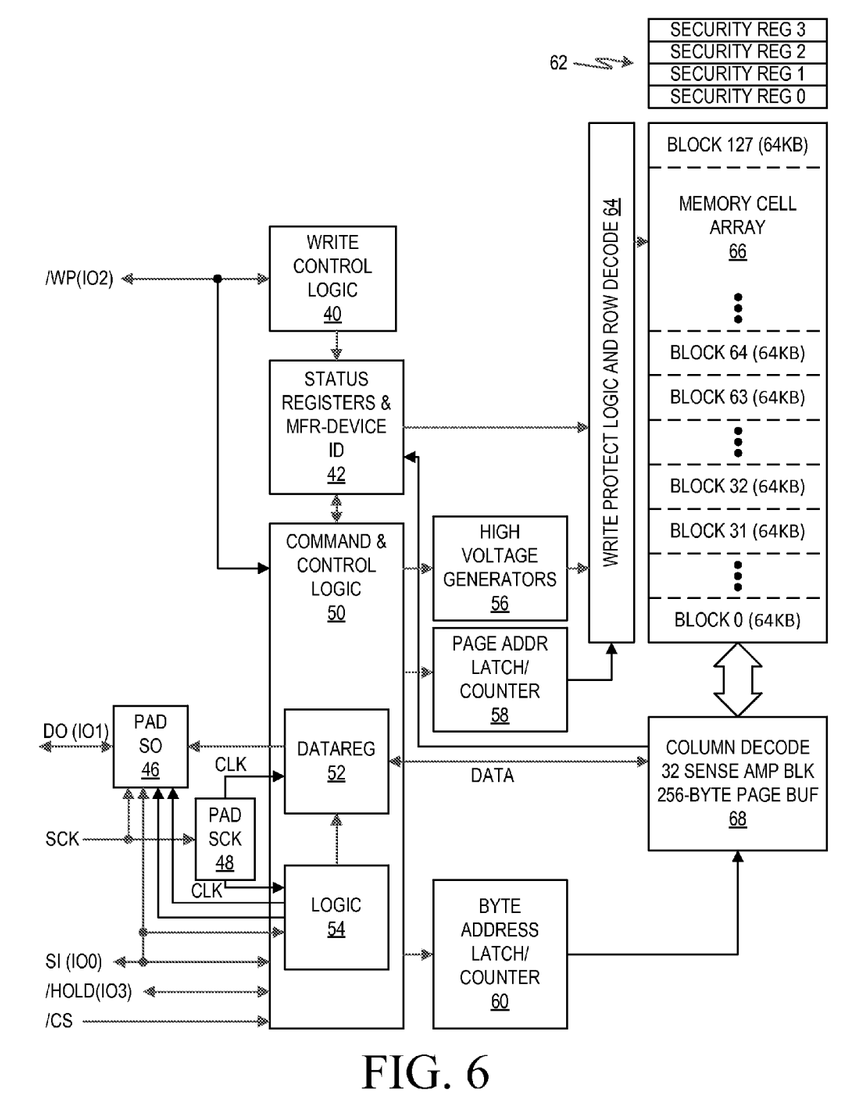
FIG. 6 is a schematic circuit diagram of a Flash memory device architecture which includes instruction pre-decode and data pre-fetch.

FIG. 6 is a block diagram showing an illustrative Flash memory device architecture which includes logic read instruction pre-decoding, logic data pre-fetch, and fast command resolution in the pad serial output circuit. A flash memory cell array 66 is addressable for read and write due to various addressing, read and write circuits, including a row decode circuit 64 and a column decode circuit 68, the later containing a 256 byte page buffer for writing to the Flash memory cell array 66 and a thirty-two sense amplifier block for reading from the Flash memory cell array 66. Write protect logic 64 is responsive to status registers 42 to prevent writing to the Flash memory cell array 66 under certain circumstances. Command and control logic 50 controls the high voltage generators 56 and page address latch and counter 58, which in turn control the row decode circuit 64. The command and control logic 50 also controls the byte address latch and counter 60, which in turn controls the column decode circuit 68. The command and control logic 50 includes four I/O pins IO0-IO3, a buffered clock input pin CLK, an a chip select input pin/CS. SPI and QPI operations are supported, including standard SPI instructions, dual SPI instructions, quad SPI instructions, and QPI instructions. QPI operations are supported when the device is switched from Standard/Dual/Quad SPI mode to QPI mode using the "Enable QPI (38h)" instruction. The device may be switched back into Standard/Dual/Quad SPI mode using the "Disable QPI (FFh)" instruction.

Figure 7:
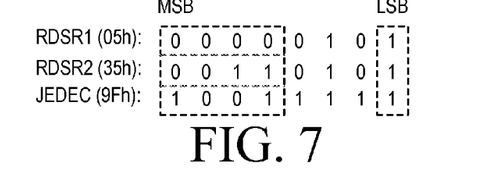
FIG. 7 is a table showing the digital representation of various logic read commands.

The instruction pre-decode implementations may be understood with respect to three instructions, namely RDSR1 (05h), RDSR2 (35h) and JEDEC (9Fh). Additional logic data and logic read instructions may be added, such as, for example, a third status register, but the principles described herein remain applicable. Since command bits are sensed at the rising edges of the clocks, any command may be unambiguously determined at the rising edge of the eighth clock. However, as shown in FIG. 7, the least significant bit ("LSB") of the JEDEC and RDSR1 and RDSR2 commands is the same, namely a one. Therefore, as between these commands an unambiguous determination may be made at the rising edge of the seventh clock. Although all of the eight command bits are not yet available to the command decoder, the instruction may be determined by resolving the command bits one clock cycle earlier, based on only seven command bits. Moreover, as shown in FIG. 7, the four most significant bits of these commands are different. Therefore, as between these commands an unambiguous determination may be made at the rising edge of the fourth clock for purposes of pre-fetching data from one of the JEDEC, SR1 and SR2 registers 22. The determination after only 4 command bits are decoded may not be unambiguous as to other instructions, but such ambiguity may be resolved based on seven bit pre-decoding and/or command resolution in the pad serial output circuit PadSO 46 (FIG. 6).

Figure 8:
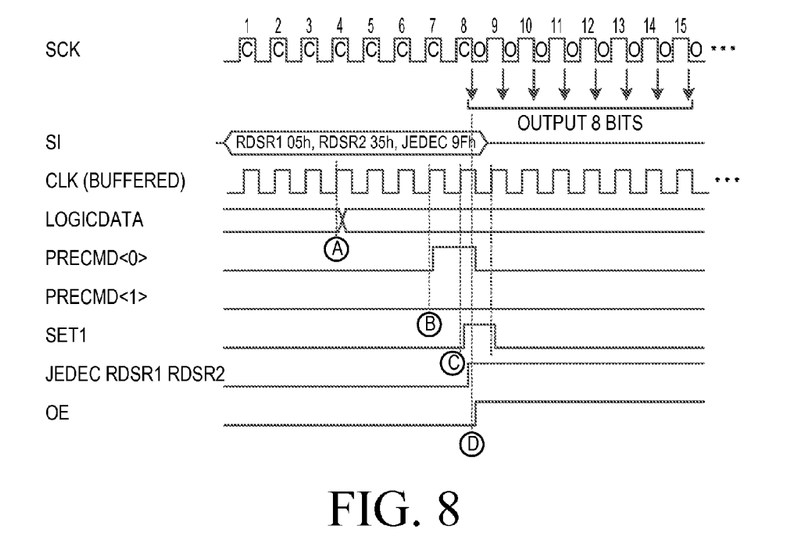
FIG. 8 is a timing diagram showing various signals involved in the operation of the Flash memory device of FIG. 6.
Figure 9:
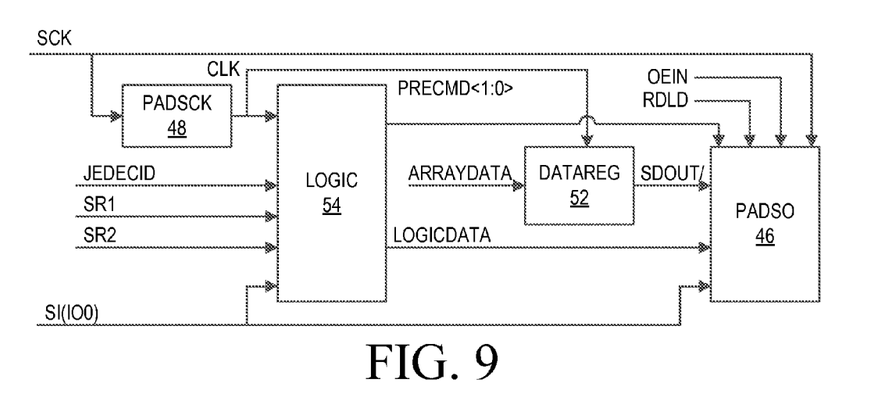
FIG. 9 is a block schematic diagram of pad, logic and data register circuits for the Flash memory device of FIG. 6.

FIG. 8 is a timing diagram for the JEDEC, RDSR1 and RDSR2 commands with four-bit instruction pre-decode and data pre-fetch, seven-bit instruction pre-decode, and instruction resolution at the pad serial output circuit. FIG. 9 is a block schematic diagram showing in greater detail the Flash memory circuit illustrated in FIG. 6 for implementing these operations. Details of logic 54 are shown in FIG. 10, and details of PadSO 46 are shown in FIG. 11.

As shown in FIG. 9, system clock SCK is applied to PadSO 46, and is also applied to PadSCK 48 where it is buffered and supplied as clock signal CLK. PadSCK 48 causes some delay, which is shown in FIG. 6. Clock CLK is applied to logic 54 and data register DataReg 52, which are within command and control logic 50 (FIG. 6). Logic 54 also receives logic data, such as JEDECID and status data from status registers SR1 and SR2. Logic 54 additionally receives serial input SI.

Figure 10:
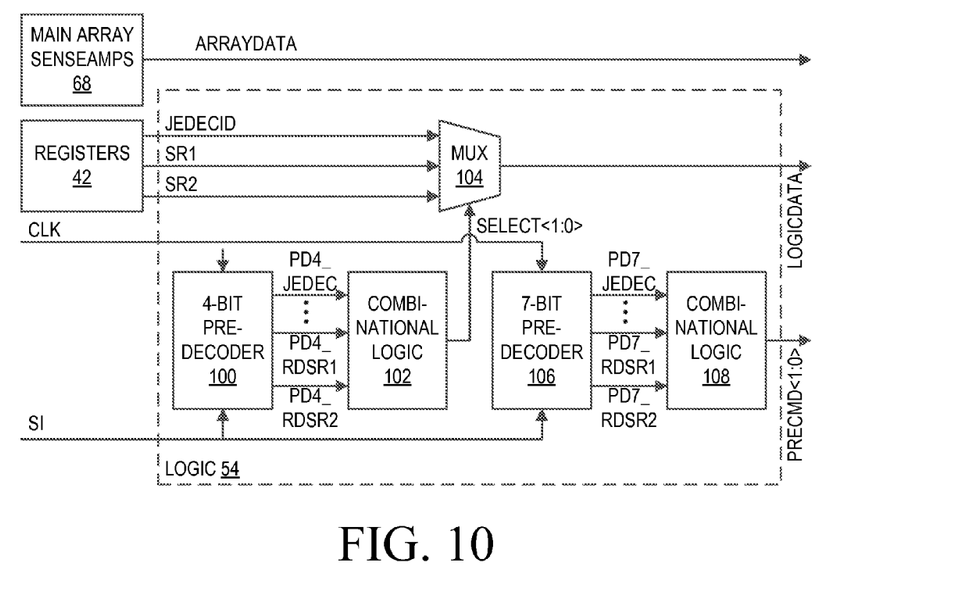
FIG. 10 is a detailed block schematic diagram of the logic circuit of FIG. 9.
Figure 11:
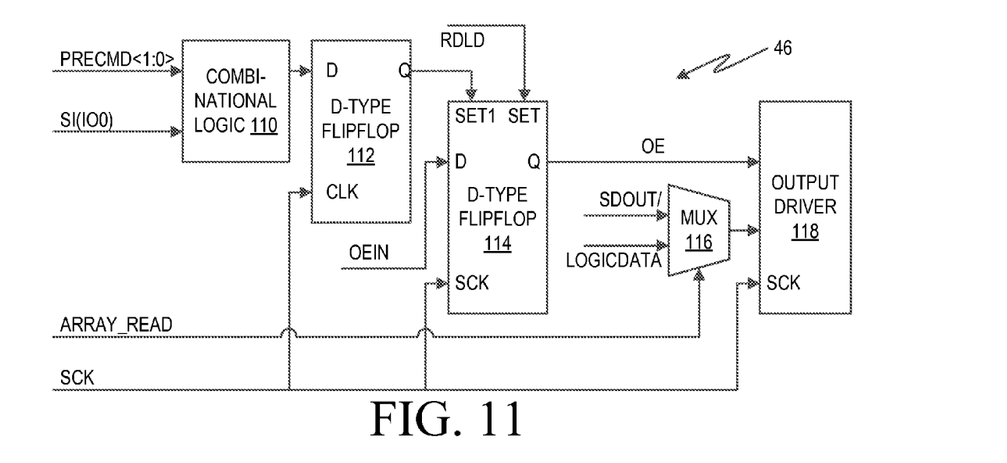
FIG. 11 is a detailed block schematic diagram of the pad output circuit of FIG. 9.

As shown in FIG. 10, logic 54 includes a four-bit pre-decoder 100 which decodes the four most significant bits of the serial input SI, and asserts signal PD4_RDSR1, PD4_RDSR2 or PD4_JEDEC if the four most significant bits are indicative of command RDSR1, command RDSR2 or command JEDEC respectively. The signal lines PD4_RDSR1, PD4_RDSR2 and PD4_JEDEC are applied to combinational logic 102, which generates a select signal SELECT<1:0> for controlling multiplexer 104. The manufacturer and part identifiers JEDECID and status data from status registers SR1 and SR2 are applied as data inputs to multiplexer 104, and one of these is selected depending on the select signal SELECT<1:0> and supplied as pre-fetched data signal LOGICDATA to PadSO 46 (FIG. 9). Therefore, as shown in FIG. 8 at time "A," LOGICDATA may be provided to PadSO 46 just after the rising edge of the fourth clock.

FIG. 10 also shows that logic 54 includes a seven-bit pre-decoder 106 which decodes the seven most significant bits of the serial input SI, and asserts signal PD7_RDSR1, PD7_RDSR2 or PD7_JEDEC if the seven most significant bits are indicative of command RDSR1, command RDSR2 or command JEDEC respectively. The signal lines PD7_RDSR1, PD7_RDSR2 and PD7_JEDEC are applied to combinational logic 108, which generates a pre-command signal PRECMD<1:0>. The pre-command signal PRECMD<1:0> may be provided to PadSO 46 at time "B" (FIG. 8) at the rising edge of the seventh clock of the buffered clock signal CLK. As shown in FIG. 8, the value of the signal PRECMD<1:0> illustratively is "0,1."

As shown in FIG. 11, PadSO 46 includes combinational logic 110, which receives signals PRECMD<1:0> and serial input SI for performing a fast command resolution during the last opcode cycle. Signal PRECMD<1:0> indicates whether the command is expected to be RDSR1, RDSR2, JEDEC, or a command other than one of these. Combinational logic 110 combines PRECMD<1:0> with the least significant bit of the command to resolve whether in fact the command is RDSR1, RDSR2 or JEDEC, and applies the result to the D input of D-type flip-flop 112 for generating the SET1 output at time "C" (FIG. 8), just after the rising edge of the eighth CLK. Signal SET1 therefore is asserted both when the command is expected to be RDSR1, RDSR2 or JEDEC, and the least significant bit of the command is a "1" (FIG. 7). Otherwise SET1 is not asserted.

PadSO 46 also includes another D-type flip-flop 114 which supplies output enable signal OE at its Q output to output driver 118. Flip-flop 114 receives signal OEIN on its D input, which is used to enable an array read. Flip-flop 114 also includes inputs SET1 and SET which respectively receive signals SET1 and RDSR. When SET1 and RDSR are both "0," the state of flip-flop 114 and enablement of the output driver 118 is determined by OEIN for performing an array read. However, when SET1 is "1" confirming that a logic read should be done, the output enable signal OE is generated at time "D" (FIG. 8), at the falling edge of the clock for the eighth command. This timing ensures that data from the output driver 118 is available at the falling edge of the clock for the eighth command, as would be expected for proper operation of the Flash memory device.

ARRAYDATA and LOGICDATA are supplied as inputs to multiplexer 116, and are selected for input to the output driver 118 in the following manner. The signal ARRAY_READ is related to an read of the Flash memory cell array 66, and is not asserted until an array read command is decoded. Therefore, by default ARRAY_READ is not asserted so that the multiplexer by default selects LOGICDATA.

In some command sets, an unambiguous determination of the command cannot be made based on the seven most significant bits of the command. The JEDEC command (9Fh, or 10011111), for example, is indistinguishable from 9Eh (10011110) based on the seven most significant bits. Similarly, the RDSR1 command (05h or 00000101) is indistinguishable from 04h ("00000100") based on the seven most significant bits. Two possible situations arise when an unambiguous determination of the command cannot be made based on the seven most significant bits of the command.

The first situation is exemplified by the command 9Eh. Presently 9Eh is an illegal command, so that anticipating the JEDEC command from the illegal 9Eh command may not be problematical as a practical matter, since outputting JEDEC data does no harm to the Flash memory and likely would be ignored by the device or system. Moreover, a well-designed system or device should not issue such an illegal command. Therefore, where ambiguity may arise due to illegal commands, the problem may be ignored. Nonetheless, it may be desirable for the Flash memory control system to avoid misinterpreting an illegal command as a valid command.

The second situation is exemplified by the command 04h. Presently 04h in some Flash memories is a write disable command, which is issued to reset the write enable latch (WEL) bit in the status register from a "1" to a "0." Therefore, a 04h command could be a valid command from a computer programming perspective. However, if such a command is interpreted by the Flash memory control circuit as the 05h RDSR1 command, the computer program would malfunction. For Flash memories that accept valid commands that cannot be unambiguously determined based on their seven most significant bits, it is desirable for the Flash memory control system to detect the potential for erroneous instruction anticipation and handle the decoding properly.

The combinational logic 110 in PadSO 46 performs ambiguity resolution for seven-bit pre-decoding in the following manner. Both the illegal command 9Eh and the write enable latch command 04h contain a zero as their least significant bit. In this case, the output of combinational logic 110 furnishes a zero to the D-input of flip-flop 112, which in turn stores a zero so that output Q furnishes a zero to the SET1 input of flip-flop 114, which does not override the logical value presented at the D input. Any assertion of OE is therefore controlled by input D.

Figure 12:
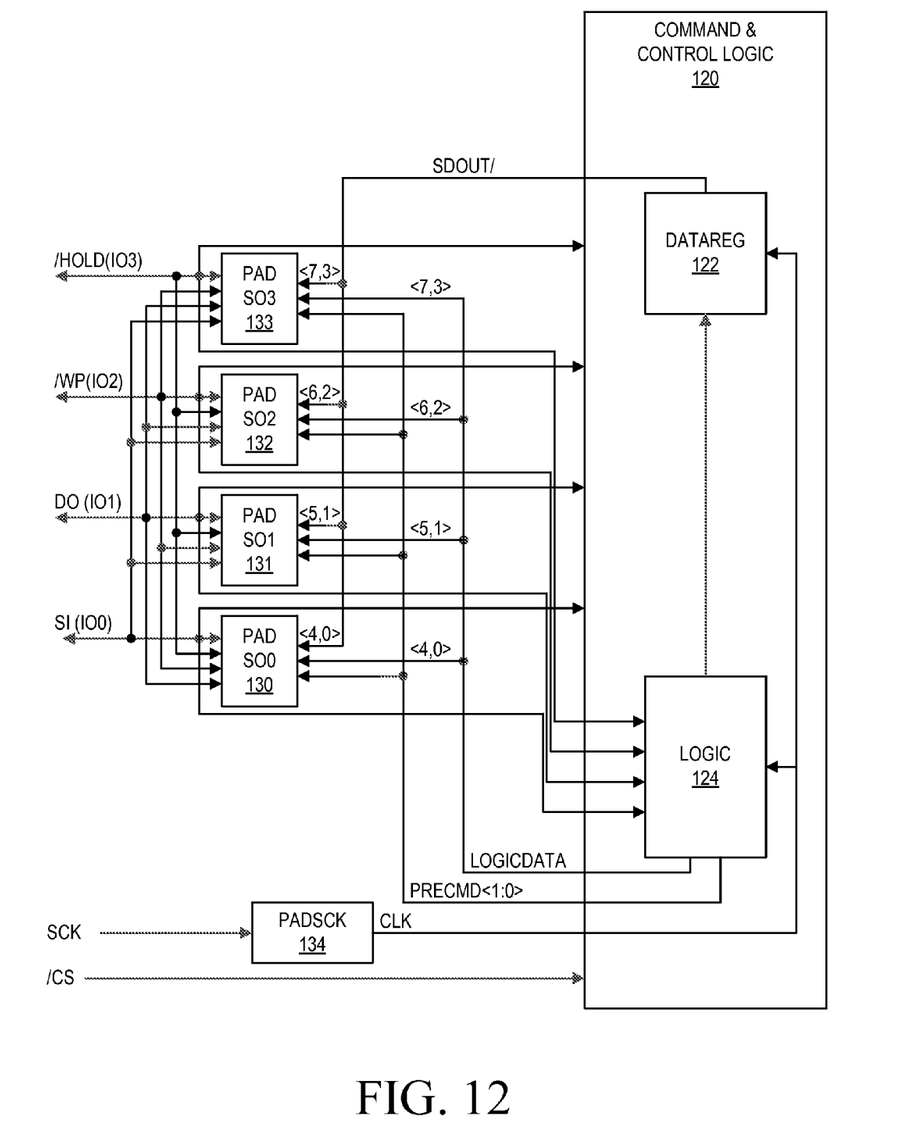
FIG. 12 is a schematic circuit diagram part of a Flash memory device architecture which includes instruction pre-decode and data pre-fetch for QPI mode.

The techniques described herein may be used with SPI or QPI interfaces. The Memory device architecture shown in FIG. 6 may be modified as shown in FIG. 12 to support one-bit and multiple bit SPI as well as QPI.

In the one-bit and multiple-bit SPI interfaces, an 8-bit command is provided in one-bit serial, specifically one bit at a time in eight clocks. This input is provided over the serial input SI. For multiple bit SPI, the Memory device architecture shown in FIG. 6 may be modified to include a number of PadSO circuits equal to the number of multiple output bits clocked at a time, and fast command resolution may be performed in each of the multiple PadSO circuits. Illustratively, PRECMD<1:0> may have the value 0,1 to enable each of the multiple PadSO circuits for output.

In the QPI interface, an 8-bit command is provided in four-bit serial, specifically four bits at a time using only two clocks. For the QPI interface, the Memory device architecture shown in FIG. 6 may be modified as shown in FIG. 12. A command and control logic block 120 includes DataReg 122 and logic 124. Four pad serial output circuits PadSO0 130, PadSO1 131, PadSO2 132 and PadSO3 133 may be used with I/O lines IO0, IO1, IO2 and IO3 routed to each of them. In addition, bits <4,0> <5,1> <6,2> and <7,3> of LOGICDATA may be respectively routed from logic 124 to PadSO0 130, PadSO1 131, PadSO2 132 and PadSO3 133, and PRECMD<1:0> may be routed from logic 124 to PadSO0 130, PadSO1 131, PadSO2 132 and PadSO3 133. Bits <4,0> <5,1> <6,2> and <7,3> of SDOUT/ may be respectively routed from DataReg 122 to PadSO0 130, PadSO1 131, PadSO2 132 and PadSO3 133. System clock SCK may be routed to each of PadSO0 130, PadSO1 131, PadSO2 132 and PadSO3 133. Fast command resolution for QPI may be performed in the following manner. Illustratively, PRECMD<1:0> may have the value 1,0 to enable PadSO0 130, PadSO1 131, PadSO2 132 and PadSO3 133 for output when IO3:IO0 is 0101 for RDSR1, 0101 for RDSR2, and 1111 for JEDEC (FIG. 7).

Figure 13:
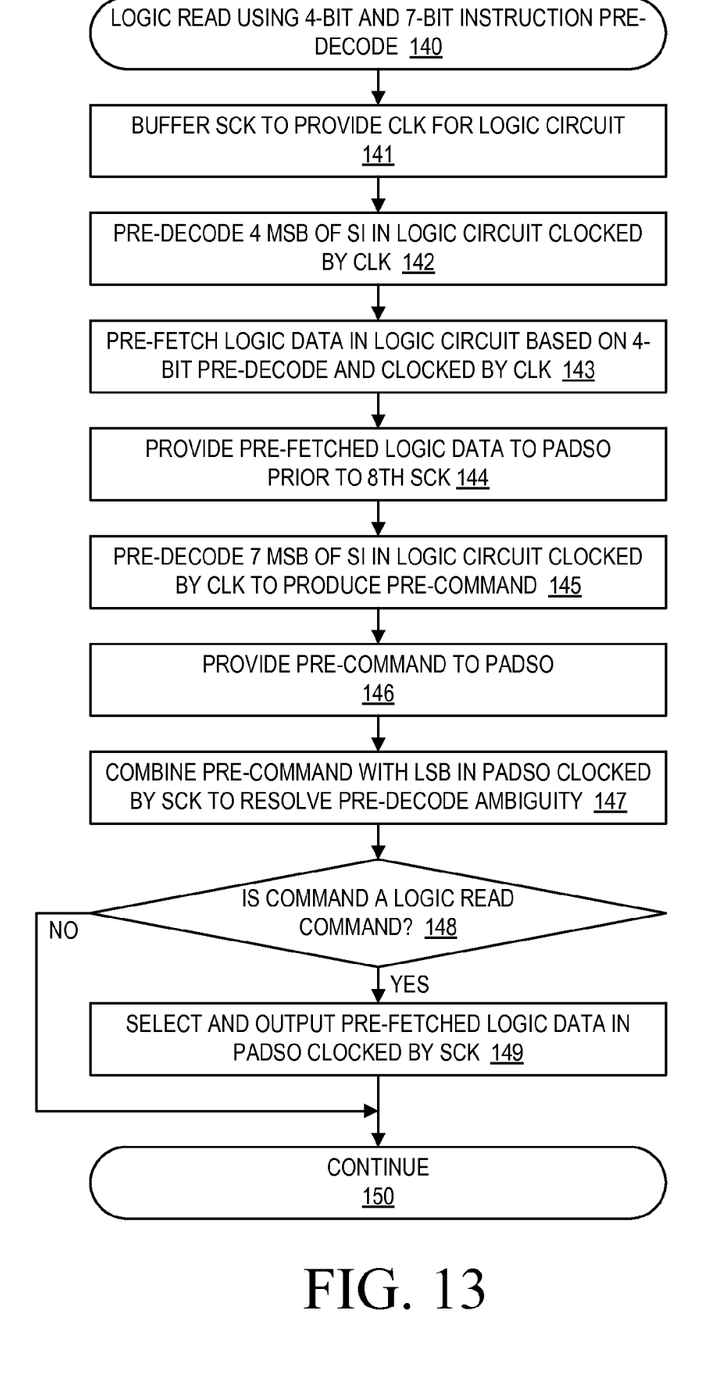
FIG. 13 is a flowchart which summarizes the operation of the Flash memory device of FIG. 6 for a logic data read using instruction pre-decode and logic data pre-fetch.

FIG. 13 is a flowchart 120 which summarizes the operations for a logic data read using four-bit and seven-bit instruction pre-decode. The system clock SCK is buffered in PadSCK 48 to provide a buffered clock CLK for logic 54 and data register 52 (block 141). After four CLK clocks the four most significant bits of the incoming command are pre-decoded in the logic 54 (block 142), and logic data such as JEDECID or the status data in status register SR1 or status register SR2 is pre-fetched in the logic 54 depending on which logic read command (if any) is pre-decoded based on four bits (block 143). The pre-fetched logic data is provided to PadSO 46 prior to the eighth SCK clock (block 144). After seven CLK clocks the seven most significant bits of the incoming command are pre-decoded in the logic 54 to generate a pre-command signal (block 145), which is provided to PadSO 46 (block 146). The pre-command signal is combined with the least significant bit at the rising edge of the eighth SCK clock in the PadSO 46 for fast command resolution, to resolve ambiguity in the pre-decoded instruction (block 147). If the command is not a logic read command (block 148 no), memory operations continue without a logic data read (block 150). If the command is a logic read command (block 148 yes), the pre-fetched logic data is selected by and output from the PadSO 46 clocked by SCK by the falling edge of the eighth SCK clock (block 149).

Advantageously, one of the logic data JEDECID, SR1 data, and SR2 data may be pre-fetched at clock 4, so even if the multiplexing is performed in logic 54, ample time is available for the selected data to be made available to multiplexer 116 in PadSO 46. Advantageously, logic data may be multiplexed by multiplexer 116 in PadSO 46 and supplied by the multiplexer 116 directly to the output driver 118, thereby avoiding signal line and other routing and gate delays. Advantageously, the PadSO 46 including the multiplexer 116 and output driver 118 may be clocked by the system clock SCK, thereby avoiding clock buffering delays. Advantageously, decoding ambiguities may be resolved by the combinational logic 110 in the PadSO 46 at the rising edge of SCK, so that any data pre-fetched in anticipation of a logic read command is not selected for input to the output driver 118 unless the command is resolved to be a logic read command.

Figure 14:
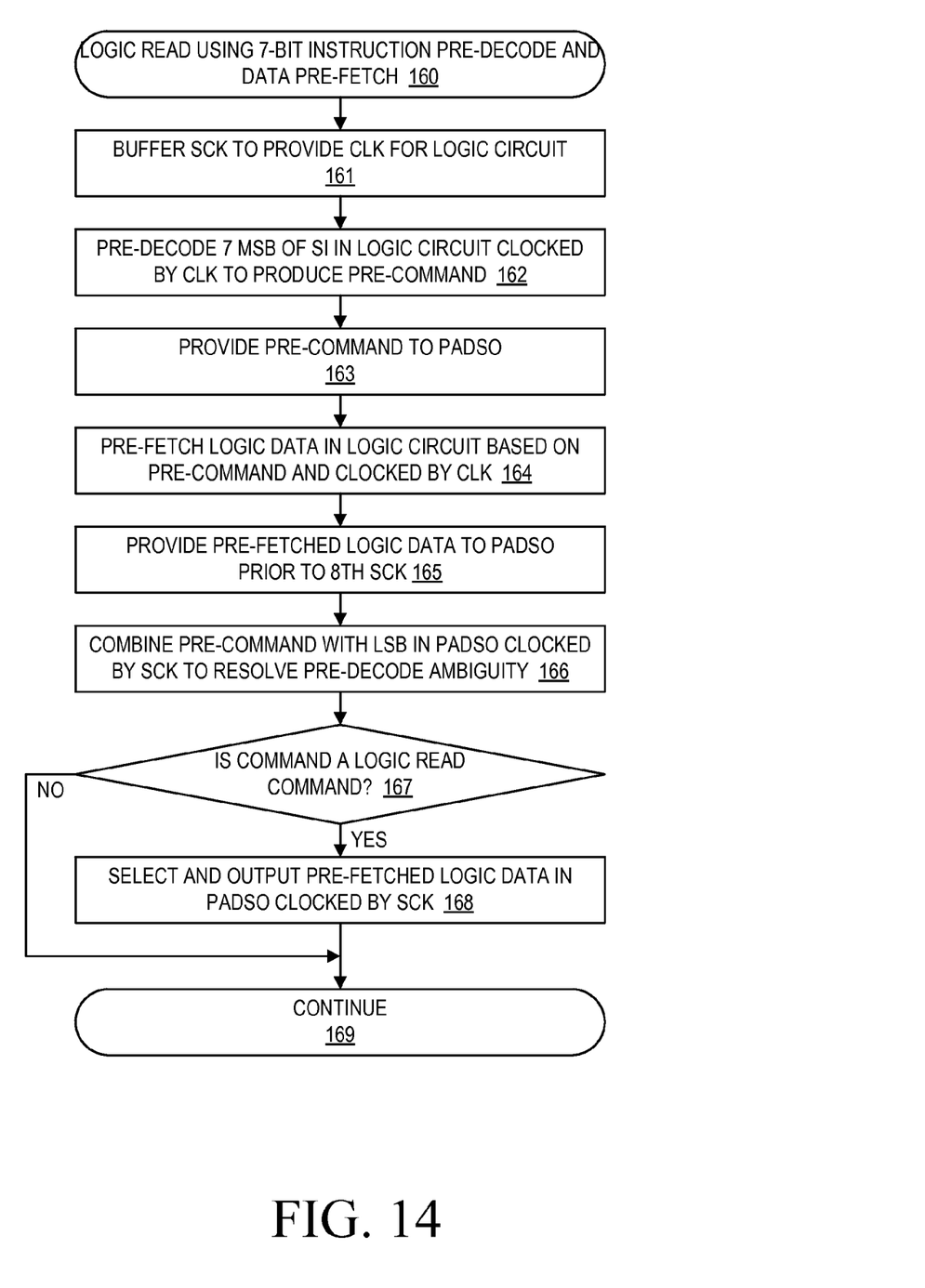
FIG. 14 is a flowchart which summarizes the operation of a Flash memory device for a logic data read using only seven-bit instruction pre-decode and logic data pre-fetch.

FIG. 14 is a flowchart 160 which summarizes the operations for a logic data read which uses seven-bit instruction pre-decode. The system clock SCK is buffered in PadSCK 48 to provide a buffered clock CLK for logic 54 and data register 52 (block 161). After seven CLK clocks the seven most significant bits of the incoming command are pre-decoded in the logic 54 to generate a pre-command signal (block 162), which is provided to PadSO 46 (block 163). In addition, logic data such as JEDECID or the status data in status register SR1 or status register SR2 is pre-fetched in the logic 54 depending on which logic read command (if any) is pre-decoded based on seven bits (block 164), and provided to PadSO 46 (block 165). The pre-command signal is combined with the least significant bit at the rising edge of the eighth SCK clock in the PadSO 46 for fast command resolution, to resolve ambiguity in the pre-decoded instruction (block 166). If the command is not a logic read command (block 167 no), memory operations continue without a logic data read (block 169). If the command is a logic read command (block 167 yes), the pre-fetched logic data is selected by and output from the PadSO 46 clocked by SCK by the falling edge of the eighth SCK clock (block 168).

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Unless otherwise explicitly stated, any specific values given herein are illustrative, and may be varied as desired. Where various timings are set forth, these timings may not be exact unless otherwise explicitly stated, but rather may vary depending on circuit layout, signal line impedance, and other practical design factors as are well known in the art. A reference to individual values indicative of a range is inclusive of all values within the range. These and other variations and modifications of the embodiments disclosed herein, including of the alternatives and equivalents of the various elements of the embodiments, may be made without departing from the scope of the invention.

The invention claimed is:

1. A Flash memory device which includes a capability of outputting logic data in response to a set of logic read commands, comprising:
   an external signal input;
   an addressable Flash memory cell array;
   a data register coupled to the addressable Flash memory cell array for receiving and storing array data from the addressable Flash memory cell array;
   a plurality of registers for storing logic data;
   a command and control logic circuit comprising:
      pre-fetch logic coupled to the external signal input for pre-fetching logic data from one of the logic data registers in accordance with a particular one of the plurality of logic read commands when a first partial sequence of most significant bits of a command received on the external signal input is predictive of the particular logic data read command; and
      output control logic coupled to the external signal input for generating a predicted logic read command signal when a second partial sequence of most significant bits of a command received on the external signal input is predictive of any one of the plurality of logic data read commands; and
   an output pad circuit coupled to the data register, the pre-fetch logic, the output control logic, and the external signal line for selecting and outputting the logic data from the pre-fetch logic when the predicted logic read command signal and a portion of the command other than the first and second partial sequences resolve receipt of any one of the plurality of logic data read commands.

2. The Flash memory device of claim 1 wherein:
   the external signal input is configured in a serial peripheral interface ("SPI") protocol and comprises a serial input signal line; and
   the output pad circuit is configured in the SPI protocol and comprising a serial data output line.

3. The Flash memory device of claim 1 wherein:
   the external signal input is configured in a quad peripheral interface ("QPI") protocol and comprises a first serial input/output signal line, a second serial input/output signal line, a third serial input/output signal line, and a fourth serial input/output signal line; and
   the output pad circuit is configured in the QPI protocol and comprises a first one bit pad output circuit coupled to the first serial input/output signal line, a second one bit pad output circuit coupled to the second serial input/output signal line, a third one bit pad output circuit coupled to the third serial input/output signal line, and a fourth one bit pad output circuit coupled to the fourth serial input/output signal line.

4. The Flash memory device of claim 1 wherein the first and second partial sequence of most significant bits is seven bits.

5. The Flash memory device of claim 4 wherein:
   the external signal input is configured in a serial peripheral interface ("SPI") protocol and comprises a serial input signal line; and
   the output pad circuit is configured in the SPI protocol and comprising a serial data output line.

6. The Flash memory device of claim 1 wherein:
   the first partial sequence of most significant bits is four bits; and
   the second partial sequence of most significant bits is seven bits.

7. The Flash memory device of claim 6 wherein:
   the external signal input is configured in a quad peripheral interface ("QPI") protocol and comprises a first serial input/output signal line, a second serial input/output signal line, a third serial input/output signal line, and a fourth serial input/output signal line; and
   the output pad circuit is configured in the QPI protocol and comprises a first one bit pad output circuit coupled to the first serial input/output signal line, a second one bit pad output circuit coupled to the second serial input/output signal line, a third one bit pad output circuit coupled to the third serial input/output signal line, and a fourth one bit pad output circuit coupled to the fourth serial input/output signal line.

8. The Flash memory device of claim 1 further comprising:
   a system clock input signal line coupled to the output pad circuit; and
   an input pad circuit coupled to the system clock for providing a buffered clock signal to the pre-fetch logic, the output control logic, and the data register.

9. A method of operating a memory device having a Flash memory cell array to provide logic data to an application in response to a logic read command having a predetermined number of command bits, comprising:
receiving a sequence of bits of a command fewer than the predetermined number of command bits, the sequence of received bits being most significant bits of the command;
pre-decoding the sequence of received bits in a logic circuit of the memory device to identify when the sequence of received bits matches a corresponding sequence of bits of a logic read command;
completing decoding of remaining bits of the command in a pad output circuit to identify when the match in the pre-decoding step correctly predicts the logic read command; and
outputting logic data in accordance with the logic read command.

10. A method of operating a memory device having a Flash memory cell array to provide logic data to an application in response to logic read commands having a predetermined number of command bits, comprising:
receiving a first sequence of bits of a command fewer than the predetermined number of command bits, the first sequence of received bits being most significant bits of the command;
pre-decoding the first sequence of received bits in a logic circuit of the memory device to identify when the first sequence of received bits matches a corresponding sequence of bits of a logic read command;
pre-fetching logic data in accordance with the logic read command matched in the pre-decoding step;
receiving a second sequence of bits of a command fewer than the predetermined number of command bits and greater than the first sequence of bits, the second sequence of received bits being most significant bits of the command;
pre-decoding the second sequence of received bits in a logic circuit of the memory device to identify when the second sequence of received bits matches a corresponding sequence of bits of a logic read command;
completing decoding of remaining bits of the command in a pad output circuit to identify when the match in the second sequence pre-decoding step correctly predicts the logic read command; and
outputting the logic data pre-fetched in the pre-fetching step.

11. The method of claim 10 wherein the first and second sequence of most significant bits is seven bits.

12. The method of claim 10 wherein:
the first sequence of most significant bits is four bits; and
the second sequence of most significant bits is seven bits.

* * * * *